(12) United States Patent
Bonart et al.

(10) Patent No.: US 12,191,285 B2
(45) Date of Patent: Jan. 7, 2025

(54) OPTICAL PROJECTION DEVICE HAVING A GRID STRUCTURE

(71) Applicant: Infineon Technologies AG, Neubiberg (DE)

(72) Inventors: Dietrich Bonart, Bad Abbach (DE); Frank Singer, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 548 days.

(21) Appl. No.: 17/523,023

(22) Filed: Nov. 10, 2021

(65) Prior Publication Data

US 2023/0163107 A1    May 25, 2023

(51) Int. Cl.
| | |
|---|---|
| *H01L 25/075* | (2006.01) |
| *H01L 25/16* | (2023.01) |
| *H01L 33/00* | (2010.01) |
| *H01L 33/38* | (2010.01) |
| *H01L 33/44* | (2010.01) |
| *H01L 33/60* | (2010.01) |
| *H01L 33/40* | (2010.01) |

(52) U.S. Cl.
CPC ........ *H01L 25/0753* (2013.01); *H01L 25/167* (2013.01); *H01L 33/0095* (2013.01); *H01L 33/385* (2013.01); *H01L 33/44* (2013.01); *H01L 33/60* (2013.01); *H01L 33/0093* (2020.05); *H01L 33/405* (2013.01); *H01L 2933/0016* (2013.01); *H01L 2933/0025* (2013.01); *H01L 2933/0058* (2013.01)

(58) Field of Classification Search
CPC ............... H01L 25/0753; H01L 25/167; H01L 33/0095; H01L 33/385; H01L 33/44; H01L 33/60; H01L 33/0093; H01L 33/405; H01L 2933/0016; H01L 2933/0025; H01L 2933/0058; H01L 33/504; H01L 33/58; H01L 27/156
USPC ........................................................... 257/91
See application file for complete search history.

(56) References Cited

U.S. PATENT DOCUMENTS

| | | | |
|---|---|---|---|
| 7,456,500 B2* | 11/2008 | Kromotis | ............ H01L 25/0753 257/676 |
| 10,700,114 B2* | 6/2020 | Honda | ................... H01L 27/146 |
| 10,998,464 B2* | 5/2021 | Kang | ....................... H01L 33/50 |
| 11,094,742 B2* | 8/2021 | Gasse | ................. H01L 27/1443 |
| 11,581,464 B2* | 2/2023 | Gasse | ..................... H01L 33/62 |
| 2017/0038055 A1* | 2/2017 | Daniels | ................... H01L 24/95 |
| 2021/0126157 A1* | 4/2021 | Dupre | ............... H01L 31/03044 |

* cited by examiner

*Primary Examiner* — Vu A Vu
(74) *Attorney, Agent, or Firm* — Murphy, Bilak & Homiller, PLLC

(57) ABSTRACT

An optical projection device and a method of producing the optical projection device are described. The optical projection device includes: a plurality of LEDs (light-emitting diodes), the LEDs each including a semiconductor mesa laterally spaced apart from one another by a grid structure. Each of the semiconductor mesas includes an n-type material and a p-type material adjoining at least partly the n-type material. The grid structure at least partly laterally surrounds at least the n-type material of each of the semiconductor mesas. The grid structure includes a conductive material that electrically interconnects the n-type material of the semiconductor mesas. The grid structure is configured to block optical crosstalk between light emitted by the LEDs.

16 Claims, 11 Drawing Sheets

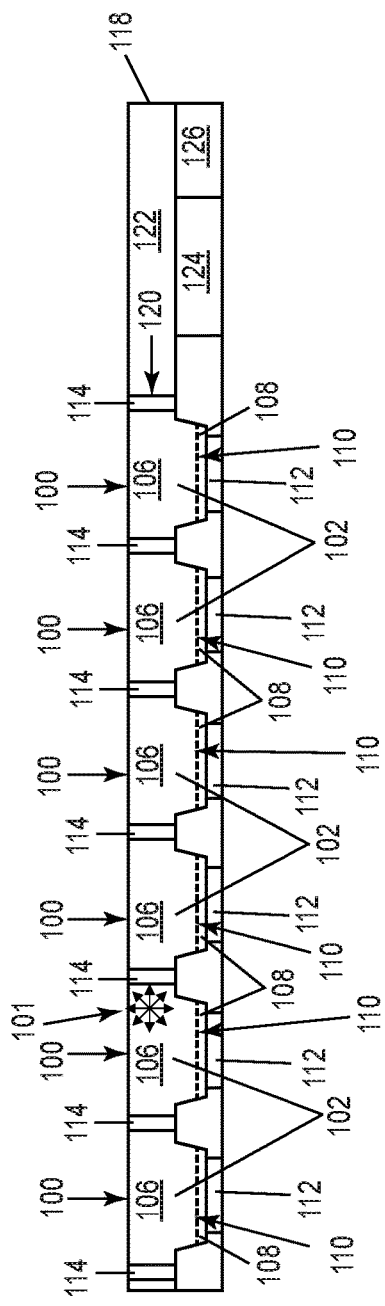
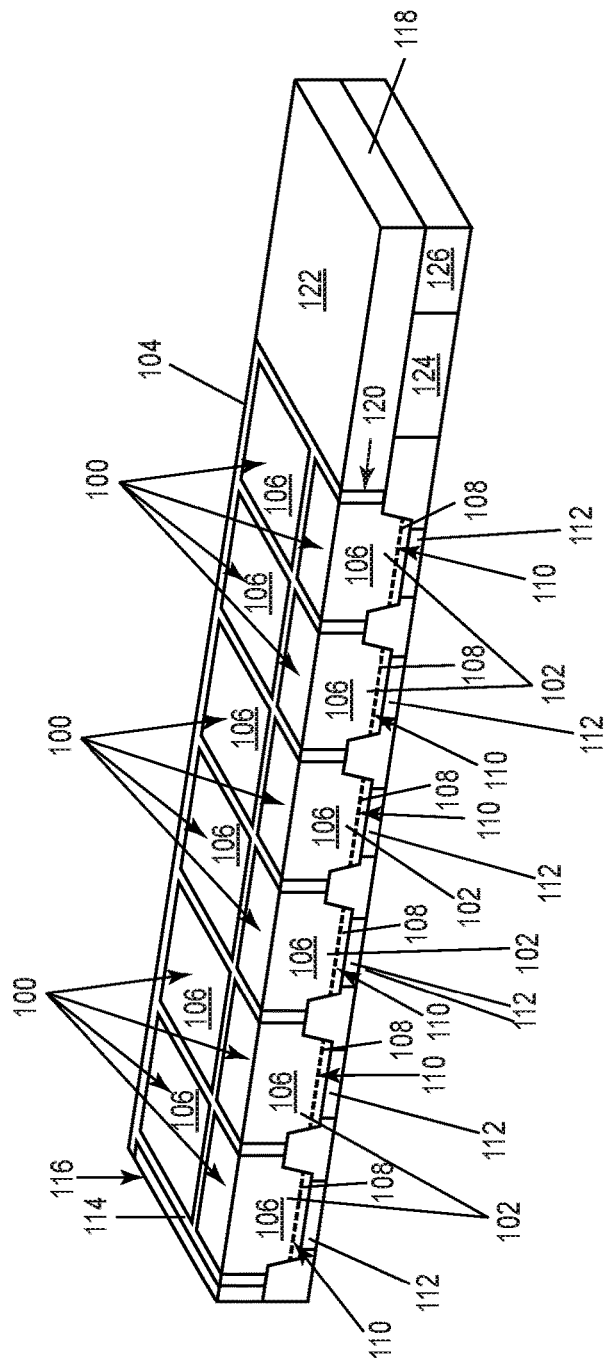
FIG. 1A
FIG. 1B

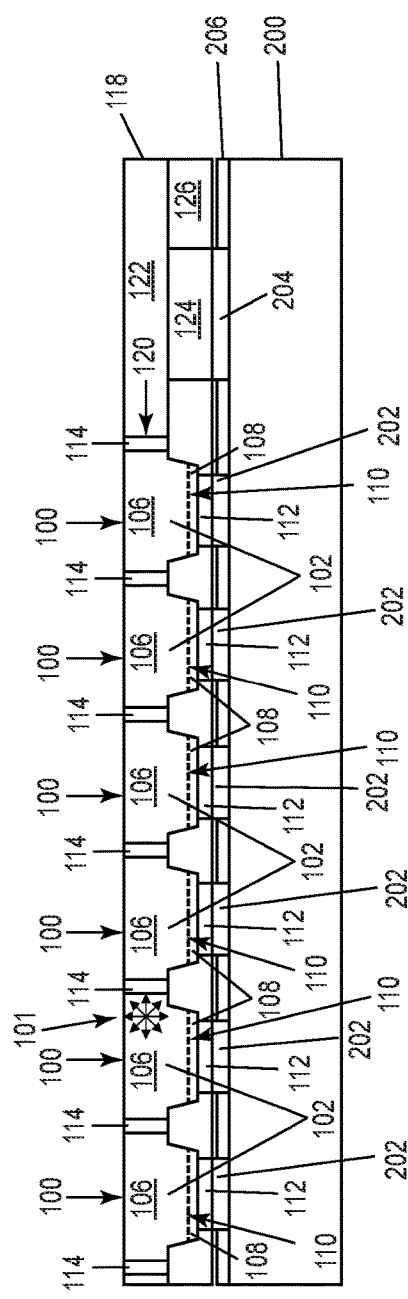
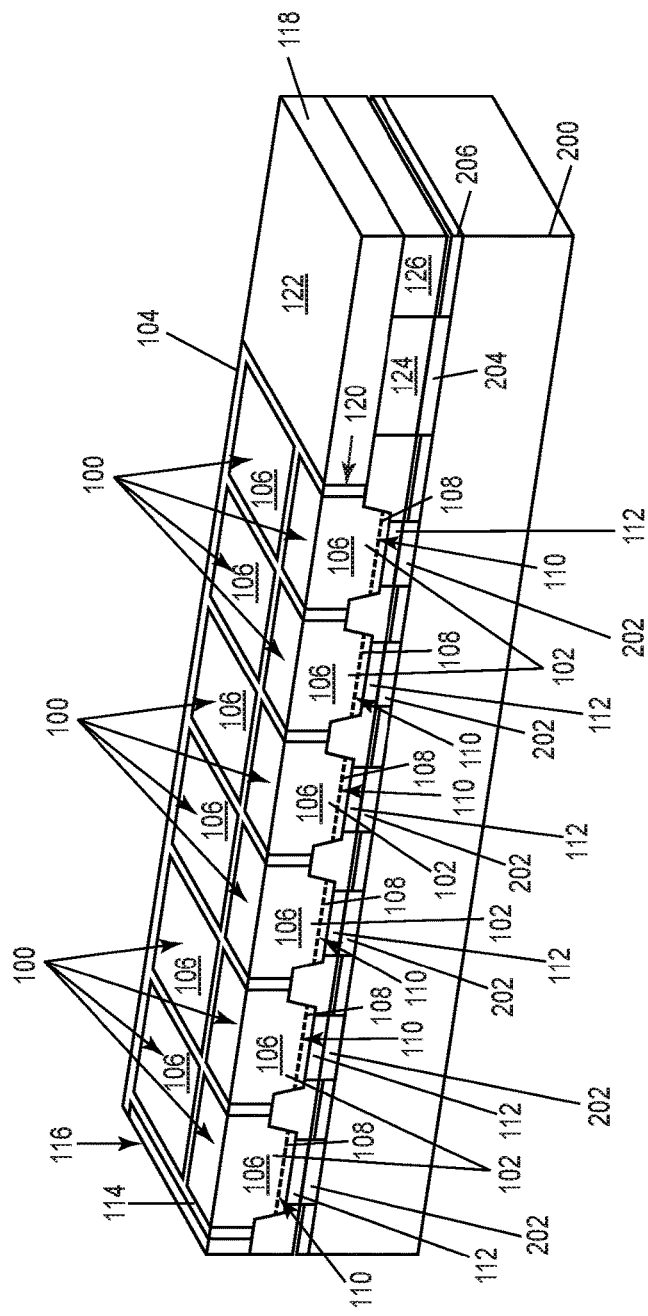
FIG. 2A
FIG. 2B

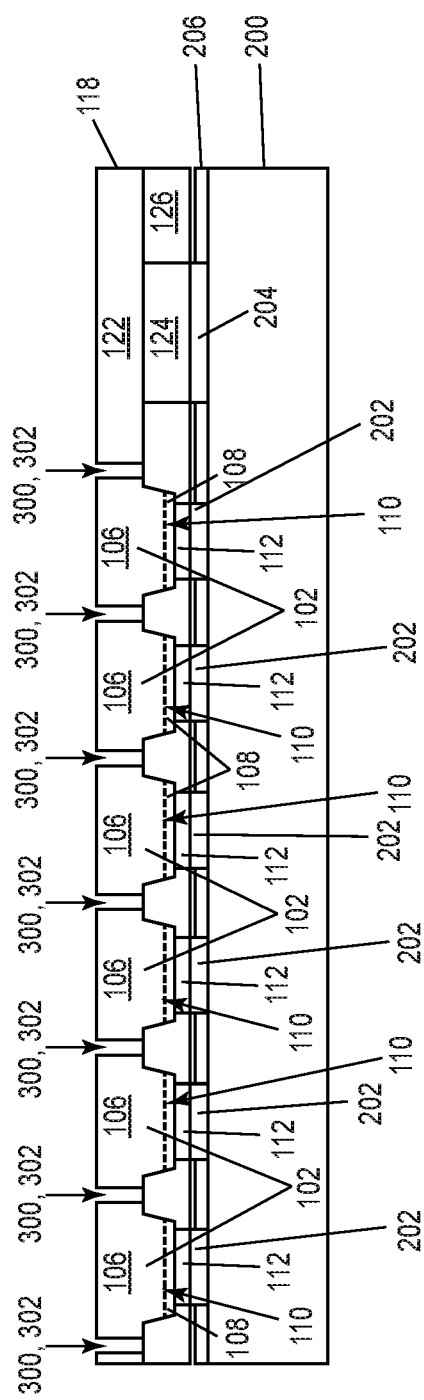
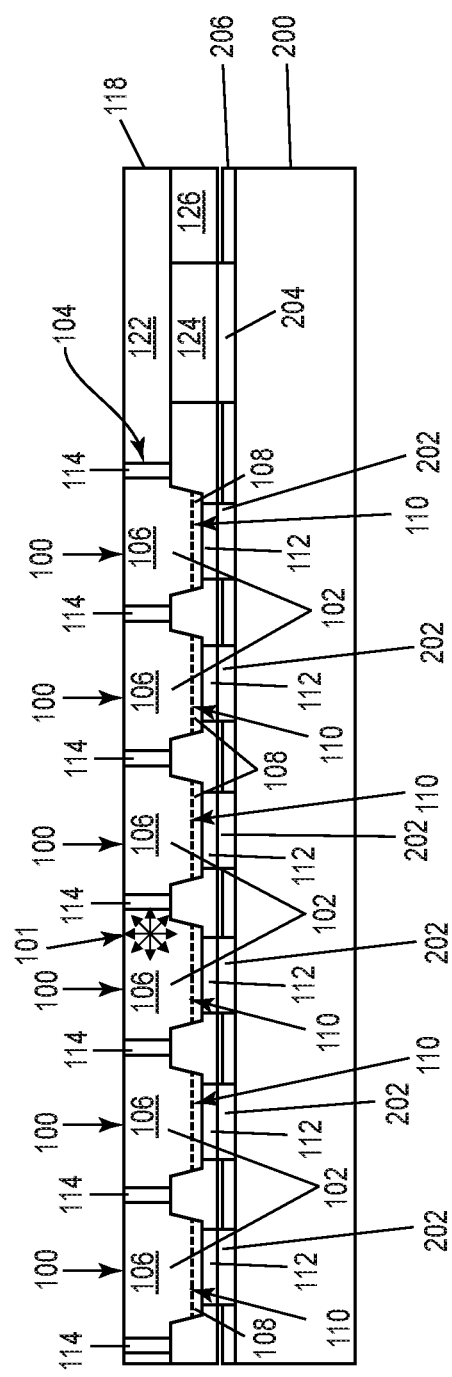

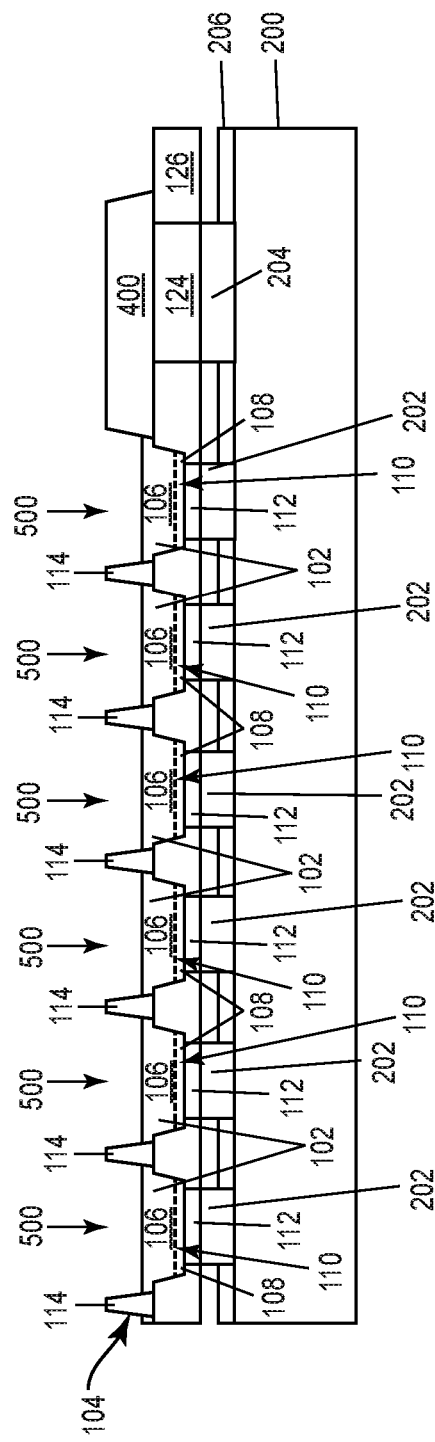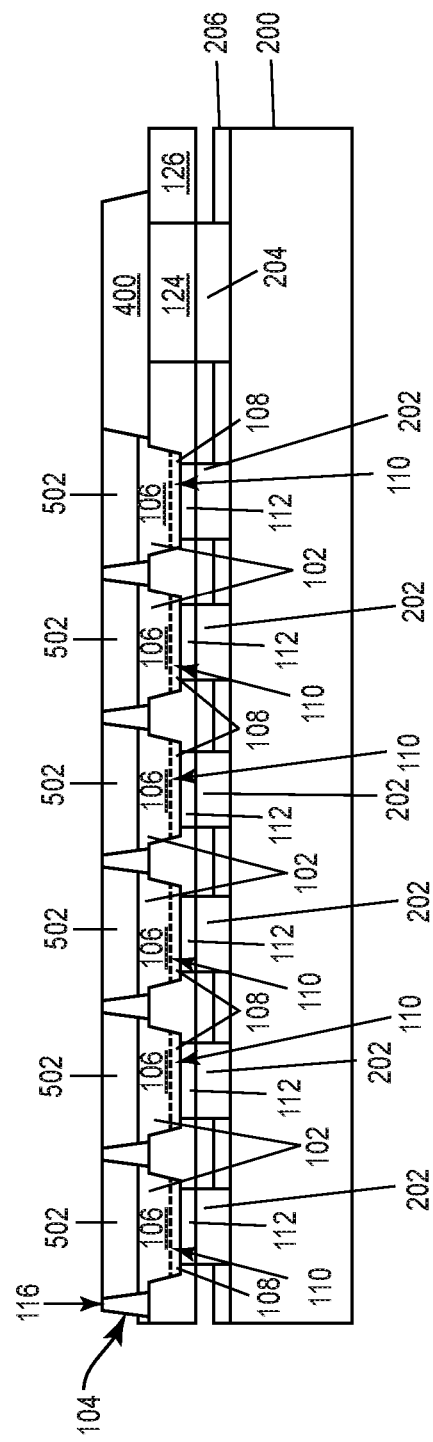
FIG. 5A
FIG. 5B

OPTICAL PROJECTION DEVICE HAVING A GRID STRUCTURE

BACKGROUND

Micro-LED (light emitting diode) displays combine very small, individually controllable light sources in a single component. New approaches micro-LED displays combine several technology components from the fields of CMOS (complimentary metal-oxide-semiconductor) thin-film technology, III/V semiconductors, LED design (electrical and optical confinement), and LED packaging for light extraction, wavelength conversion and optical isolation between the pixels. This complex task makes it difficult to manufacture cost-effectively under the premise of not compromising on efficiency and imaging quality.

More particularly, designing the optical path from each individual light source to the imaging optics in such a way that there is as little crosstalk as possible between the individual pixels is highly challenging for projection applications. Conventional solutions take this design consideration into account only to a limited extent. Furthermore, very complex solutions are sometimes used to separate the individual pixels.

Thus, there is a need for an improved micro-LED display device and corresponding method of production.

SUMMARY

According to an embodiment of an optical projection device, the optical projection device comprises: a plurality of LEDs (light-emitting diodes), the LEDs each comprising a semiconductor mesa laterally spaced apart from one another by a grid structure, wherein each of the semiconductor mesas comprises an n-type material and a p-type material adjoining at least partly the n-type material, wherein the grid structure at least partly laterally surrounds at least the n-type material of each of the semiconductor mesas, wherein the grid structure comprises a conductive material that electrically interconnects the n-type material of the semiconductor mesas, wherein the grid structure is configured to block optical crosstalk between light emitted by the LEDs.

According to an embodiment of a method of producing an optical projection device, the method comprises: providing a plurality of LEDs (light-emitting diodes), the LEDs each comprising a semiconductor mesa laterally spaced apart from one another by an open grid, each of the semiconductor mesas comprising an n-type material and a p-type material adjoining the n-type material; and forming a grid structure in the open grid and that at least partly laterally surrounds at least the n-type material of each of the semiconductor mesas, wherein the grid structure comprises a conductive material that electrically interconnects the n-type material of the semiconductor mesas, wherein the grid structure is configured to block optical crosstalk between light emitted by the LEDs.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a partial cross-sectional view of an optical projection device and FIG. 1B illustrates a top perspective view of a section of the device.

FIGS. 2A through 2C correspond to FIGS. 1A through 1C, respectively, but with a driver device attached to the optical projection device.

FIGS. 3A through 3D illustrate partial cross-sectional views of an embodiment of a method of producing the optical projection device.

FIGS. 5A and 5B illustrate partial cross-sectional views of another embodiment of a method of producing the optical projection device.

DETAILED DESCRIPTION

Figure 1C:
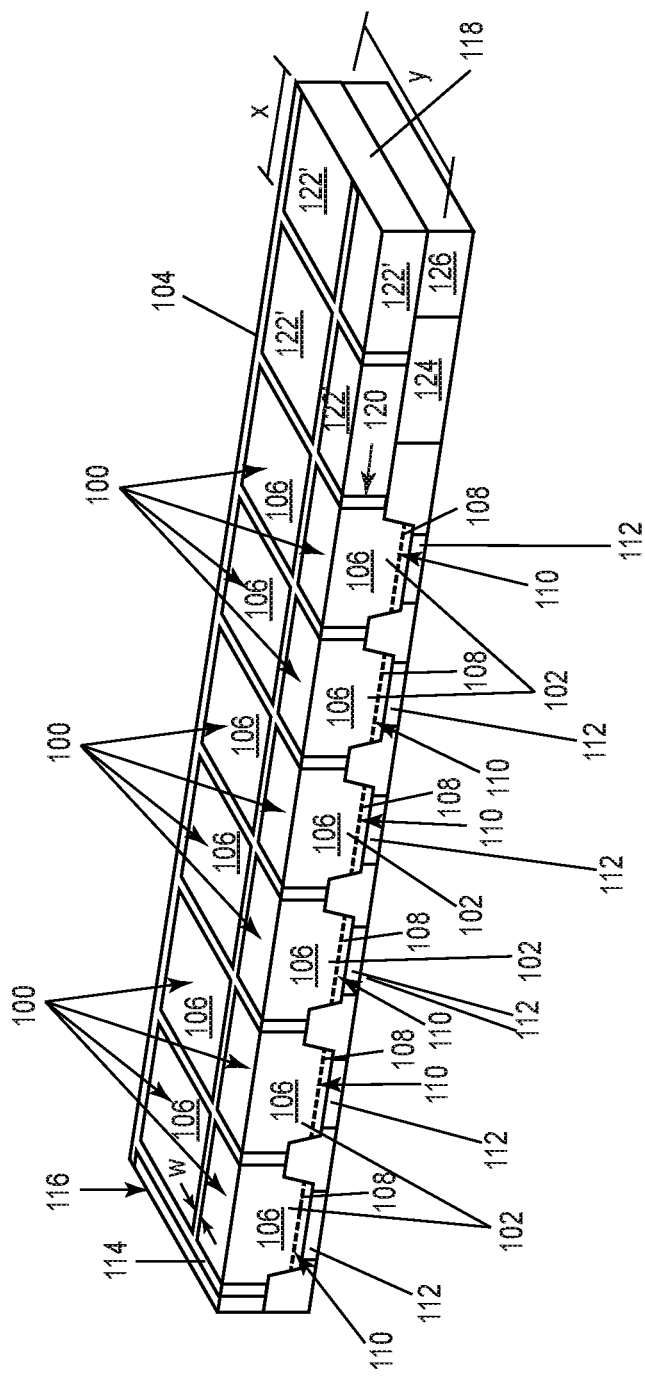
FIG. 1C illustrates a top perspective view of another embodiment of the section of the optical projection device illustrated in FIG. 1B.

Described herein are embodiments of an optical projection device having a grid structure for optically confining individual light emitting pixels, and corresponding methods of production. The grid structure at least partly laterally surrounds at least n-type material of each light emitting pixel, and electrically interconnects the n-type material of the light emitting pixels. Accordingly, the grid structure blocks optical crosstalk between light emitted by the individual pixels while providing a simplified electrical connection to the pixels.

Described next, with reference to the figures, are exemplary embodiments of the optical projection device and corresponding methods of production.

FIGS. 1A and 1B illustrate an embodiment of the optical projection device. FIG. 1A illustrates a partial cross-sectional view of the optical projection device and FIG. 1B illustrates a top perspective view of a section of the device. The optical projection device includes LEDs (light-emitting diodes) 100 which function as light emitting pixels. The optical projection device may include tens, hundreds, thousands or even more individually controllable LEDs 100.

Each LED 100 includes a semiconductor mesa 102 laterally spaced apart from one another by a grid structure 104. Each semiconductor mesa 102 includes an n-type material 106 and a p-type material 108 adjoining at least partly the n-type material 106 to form a light emitting pn junction 110. The semiconductor mesas 102 may comprise any type of semiconductor capable of emitting light such as Si, SiC, GaN, etc. In one embodiment, the semiconductor mesas 102 comprise a III/V semiconductor and the LEDs 100 emit blue light and have a width (x dimension in FIG. 1B) of 50 microns. In a plan view, the semiconductor mesas 102 may have a rectangular or square shape, e.g., as shown in FIG. 1B, or may have other shapes such as round, hexagonal, octagonal, etc.

The grid structure 104 at least partly laterally surrounds at least the n-type material of each semiconductor mesa 102. The grid structure 104 includes a conductive material 114 such as a metal or metal alloy, carbon nano tubes, a superconductor, etc. that electrically interconnects the n-type material 106 of the semiconductor mesas 102, simplifying the cathode electrical connection to the pixels 100. The pixels remain individually controllable via respective anode contacts 112 at the opposite side of the device. In addition to simplifying the cathode electrical connection to the individual light emitting pixels 100, the grid structure 104 is also configured to block optical crosstalk 101 between light emitted by the LEDs 100. Accordingly, individual pixels are optically separated from each other by the grid structure 104 and the electrical resistance of the N-side of the pixels is reduced by the conductive material 114 of the grid structure 104 which acts as a current distributor.

The conductive material 114 may be Ag which provides superior optical isolation. However, other materials that are electrically conductive and optically blocking may be used. For example, the conductive material 114 may comprise Al, Au or other noble metal, rhodium, titanium oxide, etc.

According to the embodiment illustrated in FIGS. 1A and 1B, the semiconductor mesas 102 may be coplanar with the upper surface 116 of the grid structure 104 where coplanar means lying in the same plane or in two different planes that are within process variations. For example, coplanar includes a height difference of about 2 microns or less for process variations that result in 2 microns or less in height variation. In this embodiment, the conductive material 114 of the grid structure 104 terminates at the height of the n-type material 106 such that the conductive material 114 acts as both a current spreading grid and as an optical isolation structure. Furthermore, the conductive material 114 of the grid structure 104 may also act as a cavity for the reception of a conversion material, as described in more detail later herein. In each case, the grid structure 104 allows for high pixel (LED) density and easy implementation of multi-color micro displays.

The LEDs 100 may be monolithically integrated as part of a semiconductor wafer or (chip) die 118. In this case, the grid structure 104 may include a grid of intersecting trenches 120 etched into the semiconductor wafer/die 118 such that the grid of intersecting trenches 120 laterally separates the semiconductor mesas 102 at least partly from one another. According to this embodiment, the conductive material 114 of the grid structure 104 fills the grid of intersecting trenches 120.

Separately or in combination, the grid structure 104 may contact an n-type region 122 of the semiconductor wafer/die 118 that is laterally spaced apart from the semiconductor mesas 102. According to this embodiment, the n-type region 122 is connected to a common cathode electrode 124 of the optical projection device. The conductive material 114 of the grid structure 104 electrically connects the common cathode electrode 124 to the n-type region 106 of a group of the semiconductor mesas 102. For example, the conductive material 114 of the grid structure 104 may electrically connect the common cathode electrode 124 to the n-type region 106 of each semiconductor mesa 102 included in the optical projection device or to a subset of the semiconductor mesas 102. In each case, and as described above, an individual anode electrode 112 is connected to the p-type region 108 of each one of the semiconductor mesas 102 to ensure individual pixel control. Accordingly, only a single individual contact 112 to each LED 100 is required and the size of the LEDs 100 may be reduced by about 50% by using the n-type-region 122 as a global/shared contact.

The semiconductor wafer/die 118 may include a dielectric material 126 that, together with the grid structure 104, provides the physical isolation between the LEDs 100. The grid structure 104 may have the same line width (w) across the entire optical projection device, e.g., as shown in FIG. 1C. Such a configuration allows for a homogeneous structure that is advantageous for manufacturing. FIG. 1C also shows that the n-type-region 122 may be subdivided into sub regions 122' having the same lateral dimensions (x, y in FIG. 1C) as the n-type material 106 of each LED 100 surrounded by the grid structure 104.

Figure 2C:
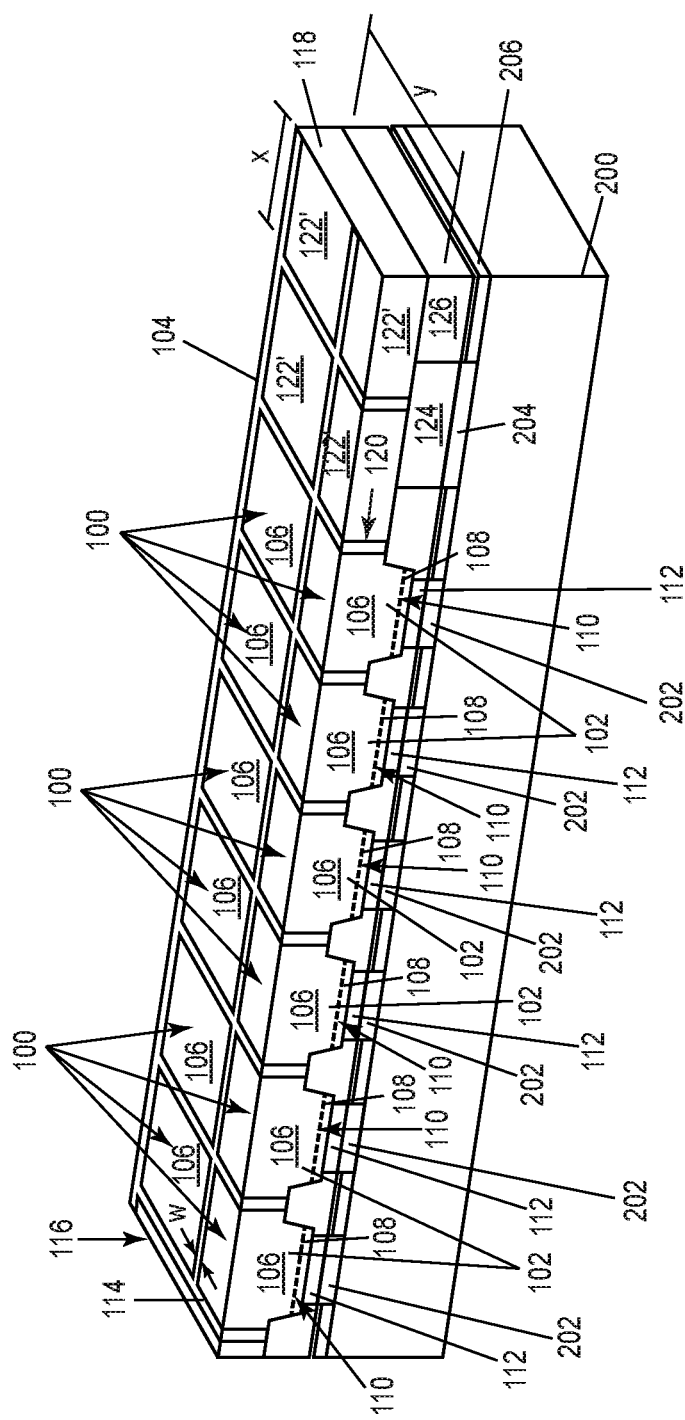

FIGS. 2A through 2C correspond to FIGS. 1A through 1C, respectively, but with a driver device 200 attached to the optical projection device. The driver device 200 is configured to drive individual ones of the LEDs 100. Each of the individual anode electrodes 112 of the optical projection device is connected to a corresponding anode electrode 202 of the driver device 200. The common cathode electrode 124 of the optical projection device is connected to a cathode electrode 204 of the driver device 200. The side of the driver device 200 facing the optical projection device may include a passivation 206, for example. In one embodiment, the driver device 200 is a CMOS (complementary metal-oxide semiconductor) device and the semiconductor mesas 102 that yield the light emitting pixels of the optical projection device comprise III/V semiconductor material. For example, the driver device 200 may be a TFT (thin film transistor) backplane. However, the driver device 200 may be a different type of driver device than a CMOS driver. For example, the driver device 200 may be a passive matrix instead. Still other driver device options are possible. In general, the driver device 200 is any type of device suitable for individually controlling/driving the individual pixels formed by the LEDs 100 of the optical projection device.

FIGS. 3A through 3D illustrate partial cross-sectional views of an embodiment of a method of producing the optical projection device. According to this embodiment, the optical projection device is produced from a semiconductor wafer 118.

Figure 3A:
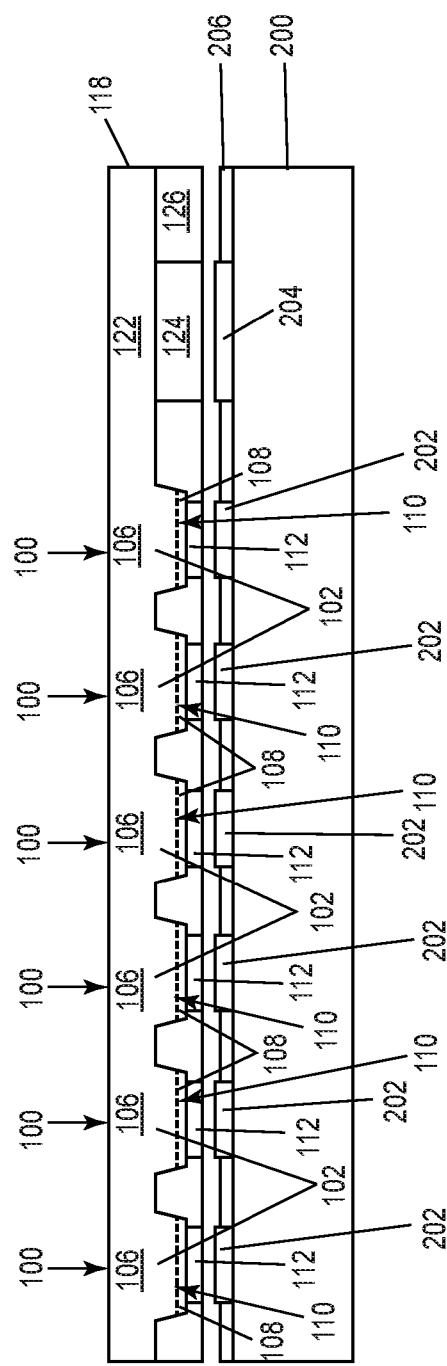

FIG. 3A shows the semiconductor wafer 118 used to produce the optical projection device vertically aligned with the driver device 200. The LEDs 100 may have already been produced at this point of the production process. The LEDs 100 instead may be produced later in the production process. In either case, the grid structure 104 has yet to be produced at this point. The driver device 200 may be provided as a separate semiconductor wafer, for example. Instead of the driver device 200, the semiconductor wafer 118 used to produce the optical projection device may be vertically aligned with a carrier such as another semiconductor wafer, a ceramic substrate, etc.

Figure 3B:
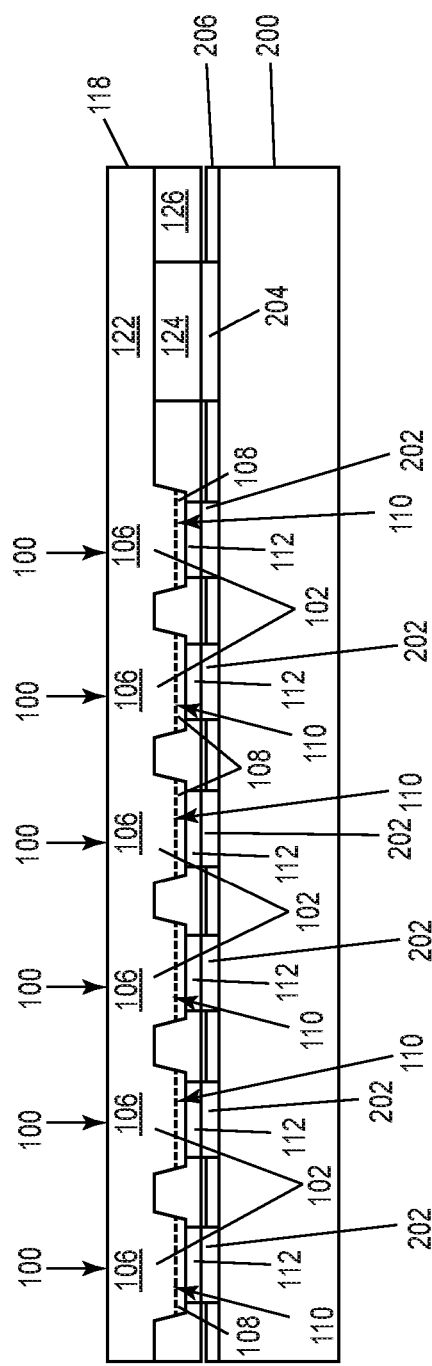

FIG. 3B shows the semiconductor wafer 118 attached to the driver device 200. Each of the individual anode electrodes 112 of the optical projection device is connected to a corresponding anode electrode 202 of the driver device 200 and the common cathode electrode 124 of the optical projection device is connected to a cathode electrode 204 of the driver device 200, e.g., using solder, a Cu-to-Cu connection, glue or other adhesive, etc.

FIG. 3C shows an open grid 300 formed in the n-type material 106 of the semiconductor wafer 118 to define the semiconductor mesas 102. In one embodiment, the open grid 300 is formed by etching a grid of intersecting trenches 302 into the n-type material 106 of the semiconductor wafer such that the grid of intersecting trenches 302 laterally separates the semiconductor mesas 102 from one another. Any standard trench etching process may be used. The trench etching may stop, e.g., on a dielectric material 126. In another example, the trenches 302 may be etched into the dielectric material 126 to improve stability/anchoring structure for the grid structure 104. In the case of GaN, e.g., this may involve an over-etch to ensure GaN residues are removed. However, the etching may not reach the dielectric material 126 for all LED cells 100 and some residual GaN may remain.

FIG. 3D shows a conductive material 114 filling the open grid 300 of intersecting trenches 302 to form the grid structure 104. The conductive material 114 may be deposited and then planarized, for example. The conductive material 114 may comprise a metal or metal alloy, carbon nano tubes, a superconductor, etc. The conductive material 114 of the grid structure 104 electrically interconnects the n-type material 106 of the semiconductor mesas 102 while also blocking optical crosstalk between light emitted by the LEDs 100, as previously described herein. The conductive material 114 may also act as a conversion layer for changing the color of light emit by the LEDs 100.

Figure 4:
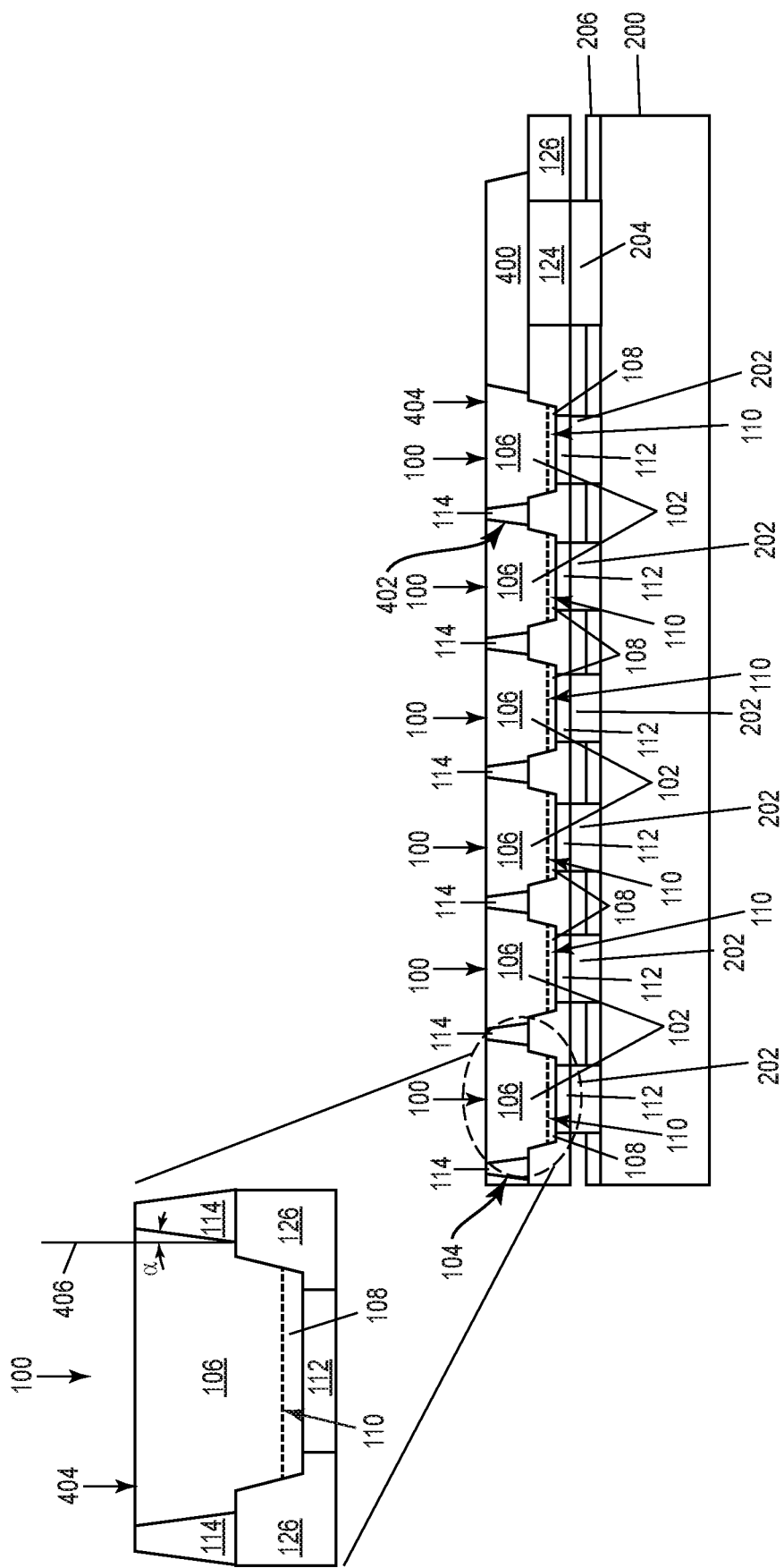
FIG. 4 illustrates a partial cross-sectional view of another embodiment of the optical projection device.

FIG. 4 illustrates a partial cross-sectional view of another embodiment of the optical projection device. According to this embodiment, the grid structure 104 contacts a metal region 400 of the semiconductor wafer 118 that is laterally spaced apart from the semiconductor mesas 102. The metal region 400 is connected to the common cathode electrode 124 of the optical projection device. The metal region 400 may comprise a metal or metal alloy such as Cu, AlCu, AlSiCu, Al, Au, rhodium, titanium oxide, etc. The metal region 400 provides less resistance than the n-type region 122 for current distribution within the area of the LED cells 100.

Also as shown in FIG. 4, the grid structure 104 may have a negative taper. For example, the sidewalls 402 of the conductive material 114 of the grid structure 104 have a negative taper such that the conductive material 114 is wider closer to the dielectric material 126 and narrower further from the dielectric material 126. In one embodiment, the negative taper of the grid structure 104 is in a range of 1 to 15 degrees (a in enlarged view of FIG. 4) relative to a normal projection 406 onto the semiconductor mesas 102. Any of the grid structure embodiments described herein may include the negative taper feature which is helpful for re-directing light to the emission layer 106 and through the emission surface 404.

FIGS. 5A and 5B illustrate partial cross-sectional views of another embodiment of a method of producing the optical projection device. In FIGS. 5A and 5B, the optical projection device includes a metal region 400 for current distribution within the area of the LED cells 100. However, the optical projection device instead may include an n-type region 122 for current distribution within the area of the LED cells 100.

FIG. 5A shows at least some of the semiconductor mesas 102 recessed below the upper surface 116 of the grid structure 104 to form cavities 500 which are laterally delimited by the grid structure 104. The cavities 500 may be formed by etching of the n-type material 106, for example. The cavities 500 may have uniform or non-uniform sizes.

FIG. 5B shows each one of the cavities 500 filled with a light conversion layer 502 configured to convert a wavelength of light emitted by the semiconductor mesa 102 aligned with the respective cavity 500. The light conversion layer 502 may be a separate layer for each semiconductor mesa 102 or group of mesas 102, or a common layer for the semiconductor mesas 102. In each case, the light conversion layer 502 changes the color of light emit by the LEDs 100, e.g., from blue light to one or more other colors such as white, green, red, etc. Any suitable material that converts light of one color into another color may be used for the light conversion layer 502. For example, a rear earth phosphor material embedded in a silicone matrix may be used as the light conversion layer 502. In this case, the rear earth phosphor material absorbs blue light and converts the light to a white spectrum. A matrix of silicone with any type of suitable light conversion particles inside may be used as the light conversion layer 502. Other light conversion material options include YAG (yttrium aluminum gallium), garnet, erbium, cerium, gadolinium, quantum dot conversion material, etc.

Figure 6A:
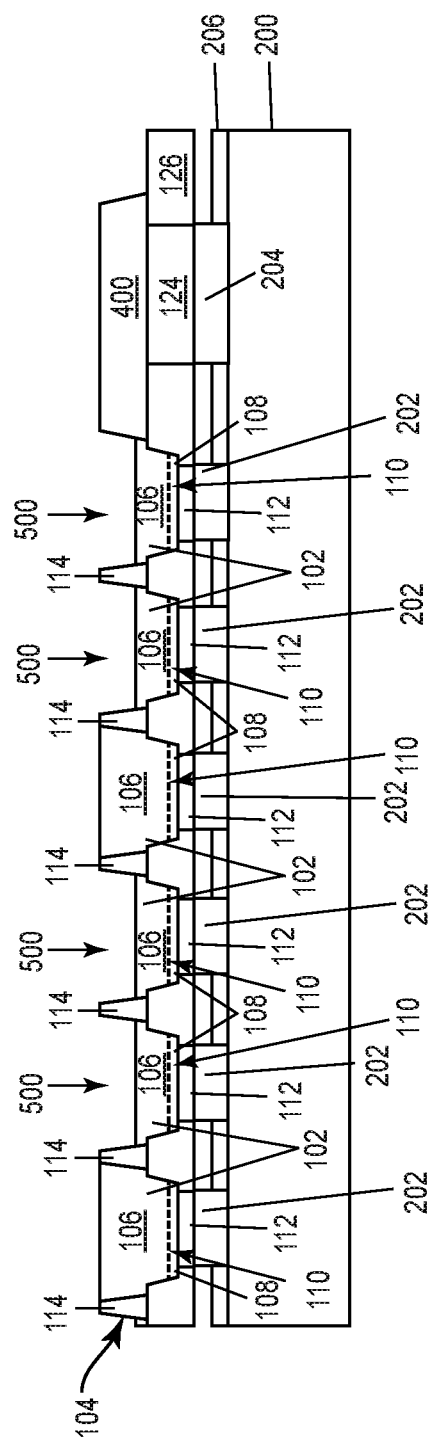
FIGS. 6A and 6B illustrate partial cross-sectional views of another embodiment of a method of producing the optical projection device.
Figure 6B:
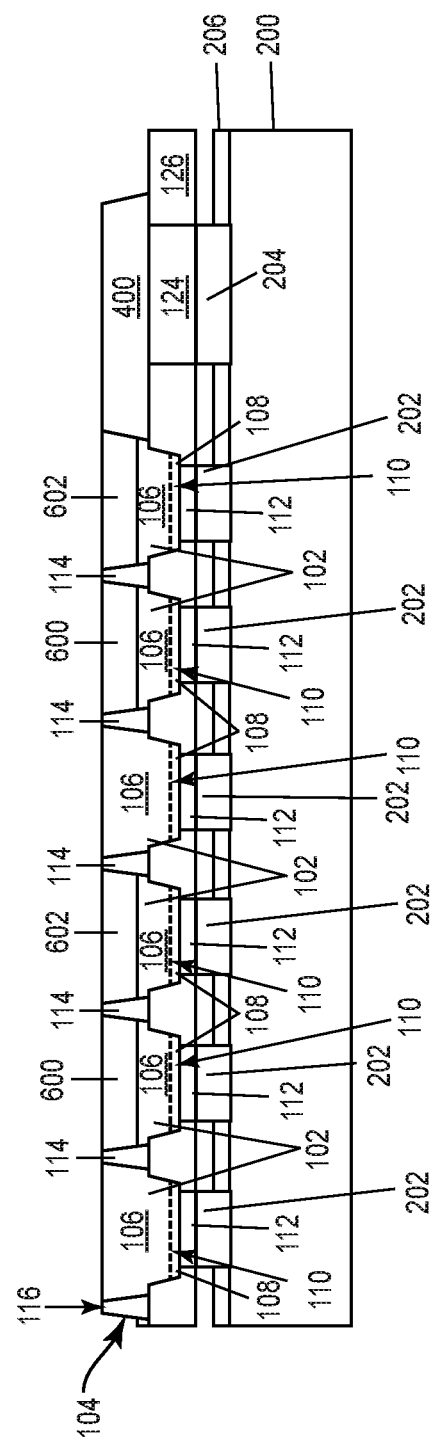

FIGS. 6A and 6B illustrate partial cross-sectional views of another embodiment of a method of producing the optical projection device. The embodiment shown in FIGS. 6A and 6B is similar to the embodiment illustrated in FIGS. 5A and 5B. Differently, however, some semiconductor mesas 102 are not recessed and the light conversion layer 502 is implemented as a separate light conversion layer 600, 602 for each semiconductor mesa 102 recessed below the upper surface 116 of the grid structure 104. The separate light conversion layer 600 in some of the cavities 500 is configured for a different wavelength conversion than the separate light conversion layer 602 in other ones of the cavities 500. Accordingly, the optical projection device may be used as a multi-color projector, e.g., as an RGB (red-green-blue) projector. In the case of an RGB projector, the LEDs 100 may be made of GaN and emit blue light, one of the separate light conversion layers 600 may convert blue light to red light and the other separate light conversion layer 602 may convert blue light into green light. In one example, the size of a cavity 500 may depend on the wavelength conversion provided by the separate light conversion layer 600, 602 that fills the respective cavity 500. Accordingly, cavities 500 that provide less efficient wavelength conversion may be made larger than cavities 500 that provide more efficient wavelength conversion to provide a generally uniform response over a wide range of wavelengths with respect to, e.g., eye-sensitivity for different colors or application specific requirements.

Figure 7:
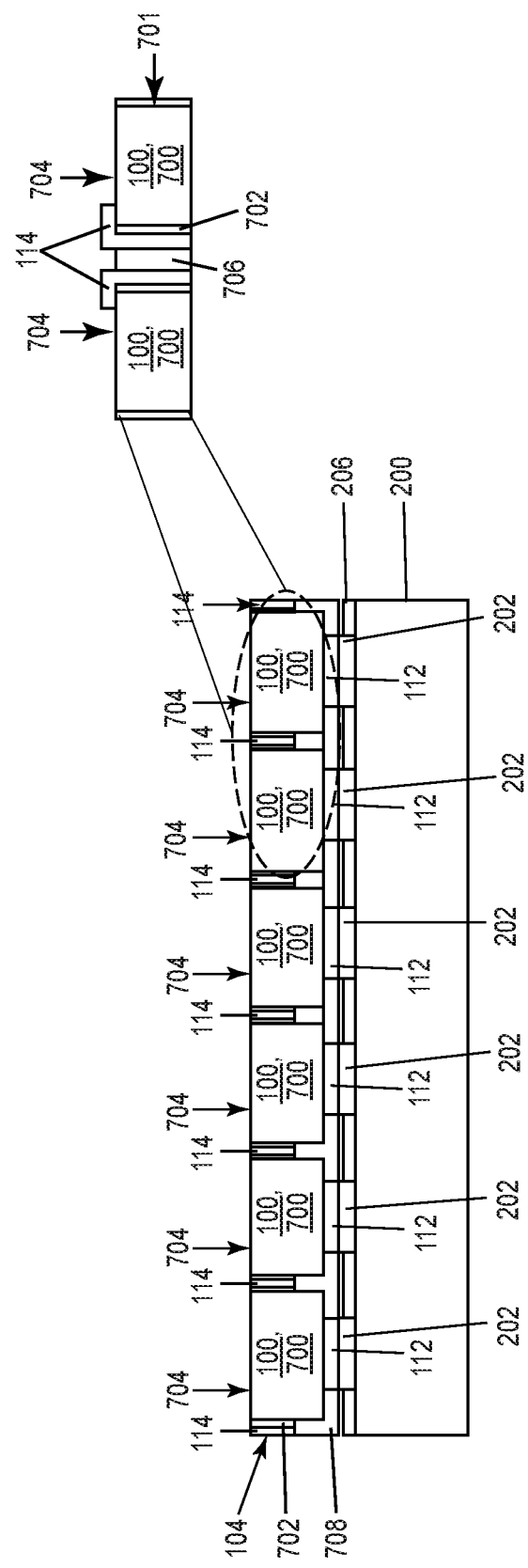
FIG. 7 illustrates a partial cross-sectional view of another embodiment of the optical projection device.

FIG. 7 illustrates a partial cross-sectional view of another embodiment of the optical projection device. According to this embodiment, the LEDs 100 are discrete semiconductor dies 700. Each discrete semiconductor die 700 includes a semiconductor mesa 102 that includes an n-type material 106 and a p-type material 108 adjoining at least partly the n-type material 106 to form a light emitting pn junction 110, e.g., as shown in FIGS. 1A and 1B. In one embodiment, the grid structure 104 includes an electrically insulating material 702 that at least partly covers the edges 701 of the discrete semiconductor dies 700. The electrically insulating material 702 of the grid structure 104 may be formed, e.g., by depositing the electrically insulating material 702 at least partly on the edges 701 of the discrete semiconductor dies 700.

The conductive material 114 of the grid structure 104 is disposed on the electrically insulating material 702 such that the electrically insulating material 702 separates the discrete semiconductor dies 700 from the conductive material 114 of the grid structure 104. For example, the conductive material 114 may be deposited in the gap between discrete semiconductor dies 700 after the electrically insulating material 702 is formed. The conductive material 114 of the grid structure 104 may electrically interconnect the n-type material 106 of the semiconductor mesas 102 within each discrete semiconductor die 700 by extending onto part of the top surface 704 of each discrete semiconductor die 700.

The electrically insulating material 702 covering the edges of the discrete semiconductor dies 700 may comprise, e.g., silicone with titanium oxide particles, oxide and/or nitride, etc. The conductive material 114 of the grid structure 104 instead may fill the entire lateral gap between adjacent discrete semiconductor dies 700. For example, the conductive material 114 of the grid structure 104 may comprise, e.g., Cu with an Ag sidewall plating.

The conductive material 114 of the grid structure 104 may not occupy the entire lateral gap between adjacent discrete semiconductor dies 700. In this case, the grid structure 104 may further include a fill material 706 that occupies the remaining space between adjacent ones of the discrete semiconductor dies 700 that is unoccupied by the conductive material 114 and the electrically insulating material 702. FIG. 7 illustrates an enlarged view of such an embodiment of the grid structure 104 between two adjacent discrete semiconductor dies 700. In one embodiment, the electrically insulating material 702 covering the edges of the discrete semiconductor dies 700 comprises oxide or nitride, the conductive material 114 of the grid structure 114 comprises Ag, and the fill material 706 comprises Cu or silicone with filler particles. A fixing material 708 such as a molding compound, epoxy, etc. may be provided to secure the discrete semiconductor dies 700 in place.

Figure 8:
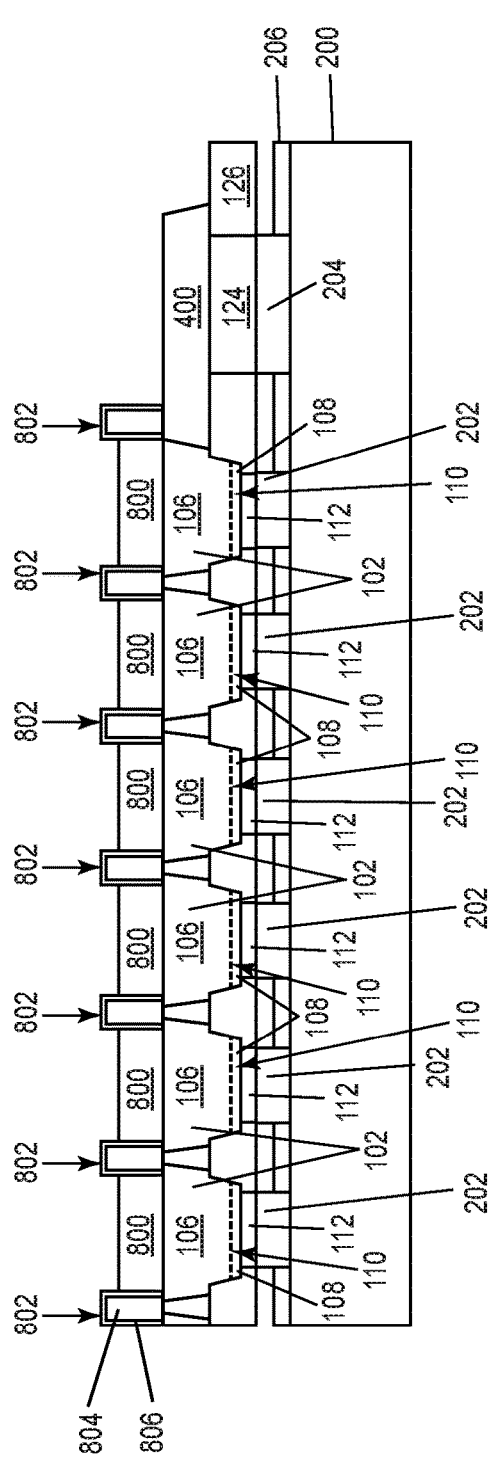
FIG. 8 illustrates a partial cross-sectional view of another embodiment of the optical projection device.

FIG. 8 illustrates a partial cross-sectional view of another embodiment of the optical projection device. According to this embodiment, and within process tolerances, the semiconductor mesas 102 are coplanar with the upper surface 116 of the grid structure 104 and the optical projection device further includes a separate light conversion layer 800 arranged on at least some of the semiconductor mesas 102. Each separate light conversion layer 800 converts a wavelength of light emitted by the semiconductor mesa 102 aligned with the respective separate light conversion layer 800.

In the case of the semiconductor mesas 102 being coplanar (within process tolerances) with the upper surface 116 of the grid structure 104, the separate light conversion layers 800 may be formed on the emission surface 404 of the n-type material 106 of the semiconductor mesas 106 without having to etch cavities into the semiconductor mesas 106. Any suitable material that converts light of one color into another color may be used for the separate light conversion layers 800. For example, a rear earth phosphor material embedded in a silicone matrix may be used as one or more of the separate light conversion layers 800. In this case, the rear earth phosphor material absorbs blue light and converts the light to a white spectrum. A matrix of silicone with any type of suitable light conversion particles inside may be used as one or more of the separate light conversion layers 800. Other light conversion material options include YAG (yttrium aluminum gallium), garnet, gadolinium, quantum dot conversion material, etc.

An isolation structure 802 laterally surrounds each of the separate light conversion layers 800 and blocks optical crosstalk between the separate light conversion layers 800. In one embodiment, the isolation structure 802 includes a wall made of an electrically insulating material 804 that blocks optical crosstalk between the separate light conversion layers 800 and a metal or metal alloy 806 coating the electrically insulating material 804. For example, the electrically insulating material 804 may be a photoresist such as SU-8 or hybrid-polymer such as ormocer (organically modified ceramic).

Figure 9:
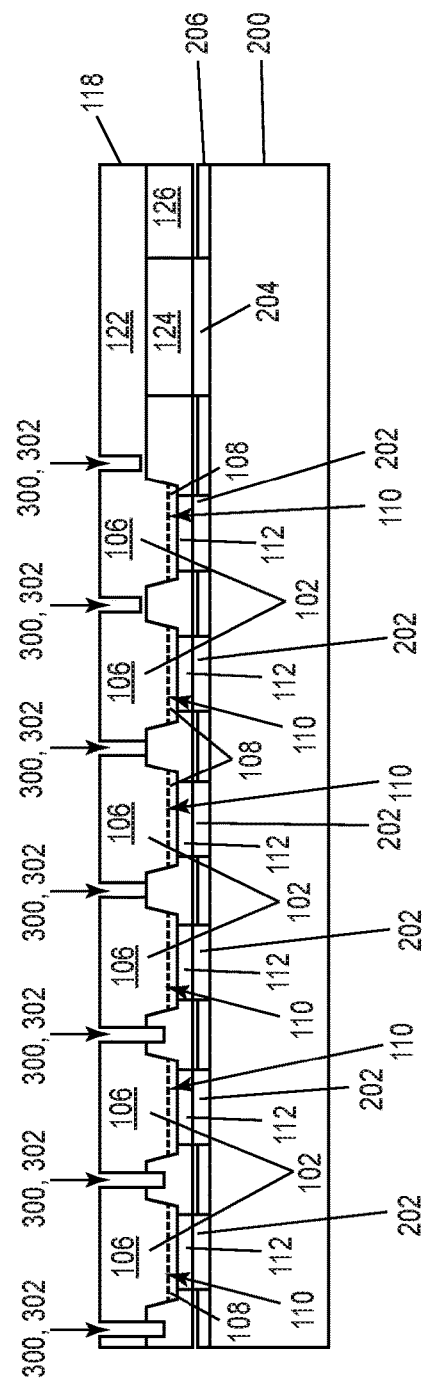
FIG. 9 illustrates a partial cross-sectional view of different embodiments of forming an open grid shown in FIG. 3C.

FIG. 9 illustrates a partial cross-sectional view of different embodiments of forming the open grid 300 shown in FIG. 3C. As previously explained herein, the open grid 300 may be formed by etching a grid of intersecting trenches 302 into the n-type material 106 of the semiconductor wafer such that the grid of intersecting trenches 302 laterally separates the semiconductor mesas 102 from one another. The grid etching process may result in trenches 302 of different depth. Accordingly, some trenches 302 may terminate above the dielectric material 126 such that some semiconductor material remains between the trench bottom and the dielectric material 126. Other trenches 302 may terminate at the dielectric material 126 such that no semiconductor material remains between the trench bottom and the dielectric material 126. Still other trenches 302 may extend into and terminate within the dielectric material 126.

As previously described herein, the optical projection device may be produced using a semiconductor wafer with epitaxially grown layers of III/V semiconductors that are patterned on the p-side in a way that yields small mesa structures. These small mesa structures are electrically connected to a pixel-specific contact on, e.g., on a CMOS wafer, e.g., by soldering. Subsequently, on the n-side a grid structure is etched down to the underlying dielectric. The etching may be performed by wet etch or by dry etch and an angle of bevel may be set with a tapering of the structure towards the emission side. Subsequently, the structure is filled with a metal that is reflective and electrically conductive. For example, for blue and green light, silver is suitable; for red light, gold is suitable. The grid structure is laterally beside the actual pixel array connected to the n-contact and the cathode conductor on the driver device, respectively. Accordingly, the grid structure supports good electron conduction of the n-epi into the depth of the LED array. With the help of the grid structure, the LED array comprises separated emission areas that do not comprise any waveguide connection between the single elements. Within the LED grid array, single pixel areas may be etched subsequently in a way that defines cavities that may be filled with light conversion material, e.g., quantum dot materials in a silicone matrix. A micro-LED array produced in this way has a plurality of separated point light sources that may be mapped optimally and rich in contrast. Instead of a CMOS driver chip, a TFT panel (e.g., glass substrate) or a simple substrate with electrically conducting supplies for a simple passive matrix triggering may be used. A flexible glass substrate or a polymer foil carrier with applied electrical conductor tracks and vias also may be used for receiving the optical projection device.

The embodiments described herein may provide energy saving and mitigation of energy use, e.g., by reducing the size of the LED cells included in an optical projection device by about 50% and by improving current distribution within the area of the LED cells.

Although the present disclosure is not so limited, the following numbered examples demonstrate one or more aspects of the disclosure.

Example 1. An optical projection device, comprising: a plurality of LEDs (light-emitting diodes), the LEDs each comprising a semiconductor mesa laterally spaced apart from one another by a grid structure, wherein each of the semiconductor mesas comprises an n-type material and a p-type material adjoining at least partly the n-type material, wherein the grid structure at least partly laterally surrounds at least the n-type material of each of the semiconductor mesas, wherein the grid structure comprises a conductive material that electrically interconnects the n-type material of the semiconductor mesas, wherein the grid structure is configured to block optical crosstalk between light emitted by the LEDs.

Example 2. The optical projection device of example 1, wherein the plurality of LEDs are part of a semiconductor wafer, wherein the grid structure comprises a grid of intersecting trenches etched into the semiconductor wafer such that the grid of intersecting trenches laterally separates the semiconductor mesas at least partly from one another, and wherein the conductive material of the grid structure fills the grid of intersecting trenches.

Example 3. The optical projection device of example 2, wherein the grid structure contacts an n-type region of the semiconductor wafer that is laterally spaced apart from the semiconductor mesas, and wherein the n-type region is connected to a cathode electrode of the optical projection device.

Example 4. The optical projection device of example 2 or 3, wherein the grid structure contacts a metal region of the semiconductor wafer that is laterally spaced apart from the semiconductor mesas, and wherein the metal region is connected to a cathode electrode of the optical projection device.

Example 5. The optical projection device of example 1, wherein the plurality of LEDs are discrete semiconductor dies, wherein the grid structure comprises an electrically insulating material that at least partly covers edges of the discrete semiconductor dies, wherein the conductive material of the grid structure is disposed on the electrically insulating material such that the electrically insulating material separates the discrete semiconductor dies from the conductive material of the grid structure.

Example 6. The optical projection device of example 5, wherein the grid structure comprises a fill material that fills a remaining space between adjacent ones of the discrete semiconductor dies that is unoccupied by the conductive material and the electrically insulating material.

Example 7. The optical projection device of example 6, wherein the electrically insulating material comprises oxide or nitride, wherein the conductive material comprises Ag, and wherein the fill material comprises Cu or silicone with filler particles.

Example 8. The optical projection device of any of examples 1 through 7, wherein the conductive material of the grid structure comprises Ag.

Example 9. The optical projection device of any of examples 1 through 7, wherein the conductive material of the grid structure is selected from the group consisting of: Al; Au; rhodium; and titanium oxide.

Example 10. The optical projection device of any of examples 1 through 9, wherein the grid structure has a negative taper.

Example 11. The optical projection device of example 10, wherein the negative taper of the grid structure is in a range of 1 to 15 degrees relative to a normal projection onto the semiconductor mesas.

Example 12. The optical projection device of any of examples 1 through 11, wherein at least some of the semiconductor mesas are recessed below an upper surface of the grid structure to form cavities which are laterally delimited by the grid structure, and wherein each one of the cavities is filled with a light conversion layer configured to convert a wavelength of light emitted by the semiconductor mesa aligned with the respective cavity.

Example 13. The optical projection device of example 12, wherein the cavities have non-uniform sizes.

Example 14. The optical projection device of example 12 or 13, wherein the light conversion layer is a separate light conversion layer for each semiconductor mesa recessed below the upper surface of the grid structure, and wherein the separate light conversion layer in some of the cavities is configured for a different wavelength conversion than the separate light conversion layer in other ones of the cavities.

Example 15. The optical projection device of any of examples 1 through 14, wherein the semiconductor mesas are coplanar with an upper surface of the grid structure, the optical projection device further comprising: a separate light conversion layer arranged on at least some of the semiconductor mesas and configured to convert a wavelength of light emitted by the semiconductor mesa aligned with the respective separate light conversion layer; and an isolation structure laterally surrounding each of the separate light conversion layers and configured to block optical crosstalk between the separate light conversion layers.

Example 16. The optical projection device of example 15, wherein the isolation structure comprises: a wall made of an electrically insulating material and configured to block optical crosstalk between the separate light conversion layers; and a metal or metal alloy coating the electrically insulating material.

Example 17. The optical projection device of example 15 or 16, wherein the electrically insulating material is a photoresist.

Example 18. The optical projection device of any of examples 1 through 17, further comprising: an individual anode electrode connected to the p-type region of each one of the semiconductor mesas; and a common cathode electrode, wherein the conductive material of the grid structure electrically connects the common cathode electrode to the n-type region of a group of the semiconductor mesas.

Example 19. The optical projection device of example 18, further comprising: a driver device configured to drive individual ones of the LEDs, wherein each of the individual anode electrodes is connected to a corresponding anode electrode of the driver device, wherein the common cathode electrode is connected to a cathode electrode of the driver device.

Example 20. The optical projection device of example 18 or 19, wherein the driver device is a CMOS (complementary metal-oxide semiconductor) device, and wherein the semiconductor mesas comprise III/V semiconductor material.

Example 21. A method of producing an optical projection device, the method comprising: providing a plurality of LEDs (light-emitting diodes), the LEDs each comprising a semiconductor mesa laterally spaced apart from one another by an open grid, each of the semiconductor mesas comprising an n-type material and a p-type material adjoining the n-type material; and forming a grid structure in the open grid and that at least partly laterally surrounds at least the n-type material of each of the semiconductor mesas, wherein the grid structure comprises a conductive material that electrically interconnects the n-type material of the semiconductor mesas, wherein the grid structure is configured to block optical crosstalk between light emitted by the LEDs.

Example 22. The method of example 21, wherein the plurality of LEDs are provided as part of a semiconductor wafer, and wherein forming the grid structure comprises: etching a grid of intersecting trenches into the semiconductor wafer such that the grid of intersecting trenches laterally separates the semiconductor mesas from one another; filling the grid of intersecting trenches with the conductive material.

Example 23. The method of example 21, wherein the plurality of LEDs are provided as discrete semiconductor dies, and wherein forming the grid structure comprises: covering at least partly edges of the discrete semiconductor dies with an electrically insulating material; and depositing the conductive material of the grid structure on the electrically insulating material such that the electrically insulating material separates the discrete semiconductor dies from the conductive material of the grid structure.

Example 24. The method of example 23, wherein forming the grid structure further comprises: filling a remaining space between adjacent ones of the discrete semiconductor dies that is unoccupied by the conductive material and the electrically insulating material.

Example 25. The method of any of examples 21 through 24, further comprising: recessing at least some of the semiconductor mesas below an upper surface of the grid structure to form cavities which are laterally delimited by the grid structure; and filling each one of the cavities with a light conversion layer configured to convert a wavelength of light emitted by the semiconductor mesa aligned with the respective cavity.

Example 26. The method of any of examples 21 through 24, wherein the semiconductor mesas are coplanar with an upper surface of the grid structure, the method further comprising: forming a separate light conversion layer on at least some of the semiconductor mesas and configured to convert a wavelength of light emitted by the semiconductor mesa aligned with the respective separate light conversion layer; and laterally surrounding each of the separate light conversion layers by an isolation structure configured to block optical crosstalk between the separate light conversion layers.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An optical projection device, comprising:
   a plurality of LEDs (light-emitting diodes), the LEDs each comprising a semiconductor mesa laterally spaced apart from one another by a grid structure,
   wherein each of the semiconductor mesas comprises an n-type material and a p-type material adjoining at least partly the n-type material,
   wherein the grid structure at least partly laterally surrounds at least the n-type material of each of the semiconductor mesas,
   wherein the grid structure comprises a conductive material that electrically interconnects the n-type material of the semiconductor mesas,
   wherein the grid structure is configured to block optical crosstalk between light emitted by the LEDs,
   wherein the semiconductor mesas are coplanar with an upper surface of the grid structure,
   wherein the optical projection device further comprises:
      a separate light conversion layer arranged on at least some of the semiconductor mesas and configured to convert a wavelength of light emitted by the semiconductor mesa aligned with the respective separate light conversion layer; and
      an isolation structure laterally surrounding each of the separate light conversion layers and configured to block optical crosstalk between the separate light conversion layers,
   wherein the isolation structure comprises:
      a wall made of an electrically insulating material and configured to block optical crosstalk between the separate light conversion layers; and
      a metal or metal alloy coating the electrically insulating material.

2. The optical projection device of claim 1, wherein the plurality of LEDs are part of a semiconductor wafer, wherein the grid structure comprises a grid of intersecting trenches etched into the semiconductor wafer such that the grid of intersecting trenches laterally separates the semiconductor mesas at least partly from one another, and wherein the conductive material of the grid structure fills the grid of intersecting trenches.

3. The optical projection device of claim 2, wherein the grid structure contacts an n-type region of the semiconductor wafer that is laterally spaced apart from the semiconductor mesas, and wherein the n-type region is connected to a cathode electrode of the optical projection device.

4. The optical projection device of claim 2, wherein the grid structure contacts a metal region of the semiconductor wafer that is laterally spaced apart from the semiconductor mesas, and wherein the metal region is connected to a cathode electrode of the optical projection device.

5. The optical projection device of claim 1, wherein the plurality of LEDs are discrete semiconductor dies, wherein the grid structure comprises an electrically insulating material that at least partly covers edges of the discrete semiconductor dies, wherein the conductive material of the grid structure is disposed on the electrically insulating material such that the electrically insulating material separates the discrete semiconductor dies from the conductive material of the grid structure.

6. The optical projection device of claim 5, wherein the grid structure comprises a fill material that fills a remaining space between adjacent ones of the discrete semiconductor dies that is unoccupied by the conductive material and the electrically insulating material.

7. The optical projection device of claim 1, wherein the grid structure has a negative taper.

8. The optical projection device of claim 7, wherein the negative taper of the grid structure is in a range of 1 to 15 degrees relative to a normal projection onto the semiconductor mesas.

9. The optical projection device of claim 1, further comprising:
   an individual anode electrode connected to the p-type region of each one of the semiconductor mesas; and
   a common cathode electrode, wherein the conductive material of the grid structure electrically connects the common cathode electrode to the n-type region of a group of the semiconductor mesas.

10. An optical projection device, comprising:
a plurality of LEDs (light-emitting diodes), the LEDs each comprising a semiconductor mesa laterally spaced apart from one another by a grid structure,
wherein each of the semiconductor mesas comprises an n-type material and a p-type material adjoining at least partly the n-type material,
wherein the grid structure at least partly laterally surrounds at least the n-type material of each of the semiconductor mesas,
wherein the grid structure comprises a conductive material that electrically interconnects the n-type material of the semiconductor mesas,
wherein the grid structure is configured to block optical crosstalk between light emitted by the LEDs,
wherein the plurality of LEDs are part of a semiconductor wafer,
wherein the grid structure comprises a grid of intersecting trenches etched into the semiconductor wafer such that the grid of intersecting trenches laterally separates the semiconductor mesas at least partly from one another,
wherein the conductive material of the grid structure fills the grid of intersecting trenches,
wherein the grid structure contacts an n-type region or metal region of the semiconductor wafer that is laterally spaced apart from the semiconductor mesas,
wherein the n-type region or metal region is connected to a cathode electrode of the optical projection device.

11. An optical projection device, comprising:
a plurality of LEDs (light-emitting diodes), the LEDs each comprising a semiconductor mesa laterally spaced apart from one another by a grid structure,
wherein each of the semiconductor mesas comprises an n-type material and a p-type material adjoining at least partly the n-type material,
wherein the grid structure at least partly laterally surrounds at least the n-type material of each of the semiconductor mesas,
wherein the grid structure comprises a conductive material that electrically interconnects the n-type material of the semiconductor mesas,
wherein the grid structure is configured to block optical crosstalk between light emitted by the LEDs,
wherein the plurality of LEDs are discrete semiconductor dies,
wherein the grid structure comprises an electrically insulating material that at least partly covers edges of the discrete semiconductor dies,
wherein the conductive material of the grid structure is disposed on the electrically insulating material such that the electrically insulating material separates the discrete semiconductor dies from the conductive material of the grid structure.

12. The optical projection device of claim 11, wherein the grid structure comprises a fill material that fills a remaining space between adjacent ones of the discrete semiconductor dies that is unoccupied by the conductive material and the electrically insulating material.

13. An optical projection device, comprising:
a plurality of LEDs (light-emitting diodes), the LEDs each comprising a semiconductor mesa laterally spaced apart from one another by a grid structure,
wherein each of the semiconductor mesas comprises an n-type material and a p-type material adjoining at least partly the n-type material,
wherein the grid structure at least partly laterally surrounds at least the n-type material of each of the semiconductor mesas,
wherein the grid structure comprises a conductive material that electrically interconnects the n-type material of the semiconductor mesas,
wherein the grid structure is configured to block optical crosstalk between light emitted by the LEDs,
wherein at least some of the semiconductor mesas are recessed below an upper surface of the grid structure to form cavities which are laterally delimited by the grid structure,
wherein each one of the cavities is filled with a light conversion layer configured to convert a wavelength of light emitted by the semiconductor mesa aligned with the respective cavity.

14. The optical projection device of claim 13, wherein the cavities have non-uniform sizes.

15. The optical projection device of claim 13, wherein the light conversion layer is a separate light conversion layer for each semiconductor mesa recessed below the upper surface of the grid structure, and wherein the separate light conversion layer in some of the cavities is configured for a different wavelength conversion than the separate light conversion layer in other ones of the cavities.

16. An optical projection device, comprising:
a plurality of LEDs (light-emitting diodes), the LEDs each comprising a semiconductor mesa laterally spaced apart from one another by a grid structure, each of the semiconductor mesas comprising an n-type material and a p-type material adjoining at least partly the n-type material, the grid structure at least partly laterally surrounding at least the n-type material of each of the semiconductor mesas, the grid structure comprising a conductive material that electrically interconnects the n-type material of the semiconductor mesas, the grid structure being configured to block optical crosstalk between light emitted by the LEDs;
an individual anode electrode connected to the p-type region of each one of the semiconductor mesas; and
a common cathode electrode,
wherein the conductive material of the grid structure electrically connects the common cathode electrode to the n-type region of a group of the semiconductor mesas.

* * * * *